(12) United States Patent
Hsu et al.

(10) Patent No.: US 7,491,082 B2
(45) Date of Patent: Feb. 17, 2009

(54) BURN-IN SOCKET HAVING REINFORCED PRESSING MEMBER AVOIDING BREAKAGE THEREOF DURING OPERATION

(75) Inventors: Hsiu-Yuan Hsu, Tu-cheng (TW); Ke-Hao Chen, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/075,143

(22) Filed: Mar. 10, 2008

(65) Prior Publication Data

US 2008/0220641 A1    Sep. 11, 2008

(51) Int. Cl.
*H01R 13/62* (2006.01)
(52) U.S. Cl. ......................... 439/330; 439/73
(58) Field of Classification Search .................. 439/330, 439/331, 70, 525, 526, 73
See application file for complete search history.

(56) References Cited

U.S. PATENT DOCUMENTS

| | | | |
|---|---|---|---|
| 5,320,550 A * | 6/1994 | Uratsuji et al. | 439/266 |
| 6,126,467 A | 10/2000 | Ohashi | |
| 6,162,066 A | 12/2000 | Glick et al. | |
| 6,517,370 B2 * | 2/2003 | Fukunaga | 439/331 |
| 6,768,653 B2 | 7/2004 | Ohashi | |
| 6,832,918 B2 * | 12/2004 | Hou | 439/70 |
| 6,863,553 B2 * | 3/2005 | Watanabe | 439/330 |

FOREIGN PATENT DOCUMENTS

JP    H2002-343522    11/2002

\* cited by examiner

*Primary Examiner*—Hien Vu
(74) *Attorney, Agent, or Firm*—Wei Te Chung

(57) ABSTRACT

An IC socket includes a base holding a plurality of contacts therein, at least one latch pivotably attached to the base, and at least one pressing member mounted on the base and being vertically movable relative to the base. The pressing member comprises at least one pair of pressing tabs extending toward the base and engaging with the latch to actuate the latch to pivotally move relatively to the base, a horizontal member physically connecting with the pair of pressing tabs, and an opening defined above the horizontal member and between the two pressing tabs. The horizontal member formed on the pressing member can enhance the intensity of the pressing member and prevent the pressing member from deformation and breakage.

7 Claims, 5 Drawing Sheets

BURN-IN SOCKET HAVING REINFORCED PRESSING MEMBER AVOIDING BREAKAGE THEREOF DURING OPERATION

BACKGROUND OF THE INVENTION

1. Field of the Invention

The present invention generally relates to a burn-in socket, and particularly, to a burn-in IC (Integrated Circuit) socket having reinforced pressing member avoiding breakage during operation thereof thereby providing reliable function to receive an IC Package therein for burn-in test.

2. Description of the Related Art

Referring to FIG. 1 in which discloses a conventional IC socket 1', the socket 1' is configured with a base 2', a slider 3' disposed above the base 2', a loading plate 4' positioned on the slider 3', a plurality of contacts (not shown) received within the slider 3' and the base 2', two pressing members 6' mounted on the base 2' and being vertically movable relative to the base 2', a pair of latches 5' pivotably connected to the base 2', and a locking apparatus located at a bottom of the base 2' and consisting of a positioning plate 8' and a bottom plate 7' located above the positioning plate 8'.

The plate-shaped pressing member 6' of the conventional IC socket 1' has a first surface 63' and a second surface 64' opposed to the first surface 63'. A pair of pressing tabs 65' extend from the second surface 64' and are intended for engaging with the latches 5'. These two pressing tabs 65' are spaced from each other and define a gap 651' therebetween.

The pressing member 6' is driven to move downwardly by an outside operating force exerted on the first surface 63' thereof, and then the pressing tabs 65' press on the latches 5' in order to drive the latches 5' to rotate relative to the base 2'. The pressing members 6' return to its original position when the operating force is stopped and the latches 5' get back to their initial position. However, since the pressing tab 65' has a certain height and is very thin in thickness, so deformation or breakage is possible to occur to the pressing tabs 65' when a overloaded operating force is abruptly applied to the pressing member 6'.

BRIEF SUMMARY OF THE INVENTION

Accordingly, it is an object of the present invention to provide an IC socket with a strengthened pressing member, which prevents the IC socket from malfunctioning due to breakage of the pressing member during operation.

To fulfill the above object, an IC socket made in accordance with the present invention includes a base holding a plurality of contacts therein, at least one latch pivotally attached to the base, and at least one pressing member moveably assembled to the base. The pressing member comprises at least one pair of pressing tabs extend toward the base and abut against the latch so as to actuate the latch to pivotally move relatively away from the base. A horizontal member physically connects with the pair of pressing tabs, and an opening is defined above the horizontal member and between the two pressing tabs.

Other objects, advantages and novel features of the invention will become more apparent from the following detailed description of the present embodiment when taken in conjunction with the accompanying drawings.

DETAILED DESCRIPTION OF THE INVENTION

Figure 1:
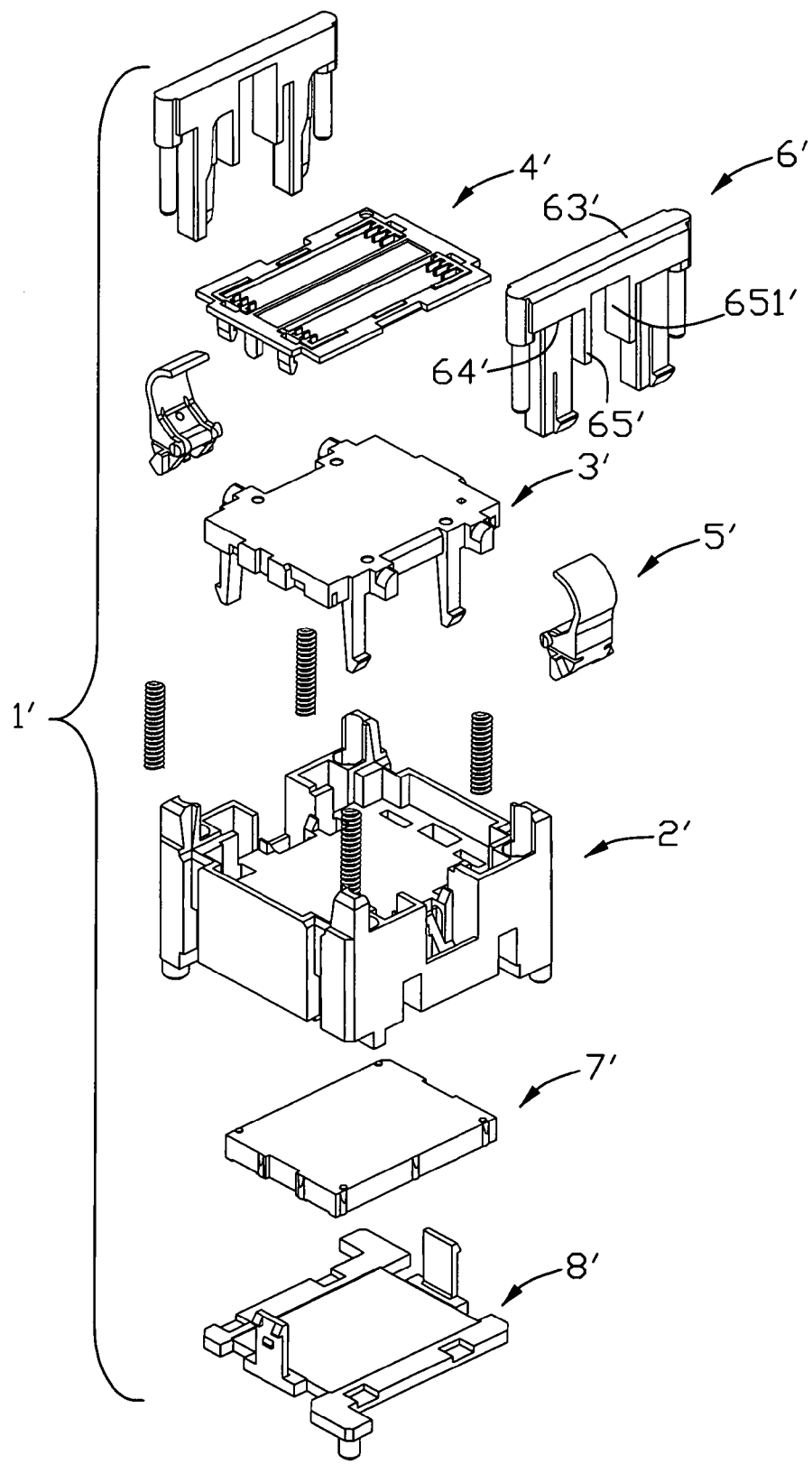
FIG. 1 is an exploded, perspective view of a conventional IC socket.

FIGS. 2-5 illustrate a preferred embodiment of a IC socket made in accordance with this invention. The IC socket 1, adapted for testing an IC package (not shown) received therein, includes a base 2 holding a plurality of contacts (not shown) therein, a slider 3 located above the base 2, a loading plate 4 positioned on the slider 3, a pair of latches 5 pivotably attached to the base 2, two pressing members 6 mounted on the base 2. The pressing members 6 are vertically movable relative to the base 2. A locking apparatus (not labeled) is located at the bottom of the base 2 and consists of a positioning plate 8 and a bottom plate 7 located above the positioning plate 8.

Figure 4:
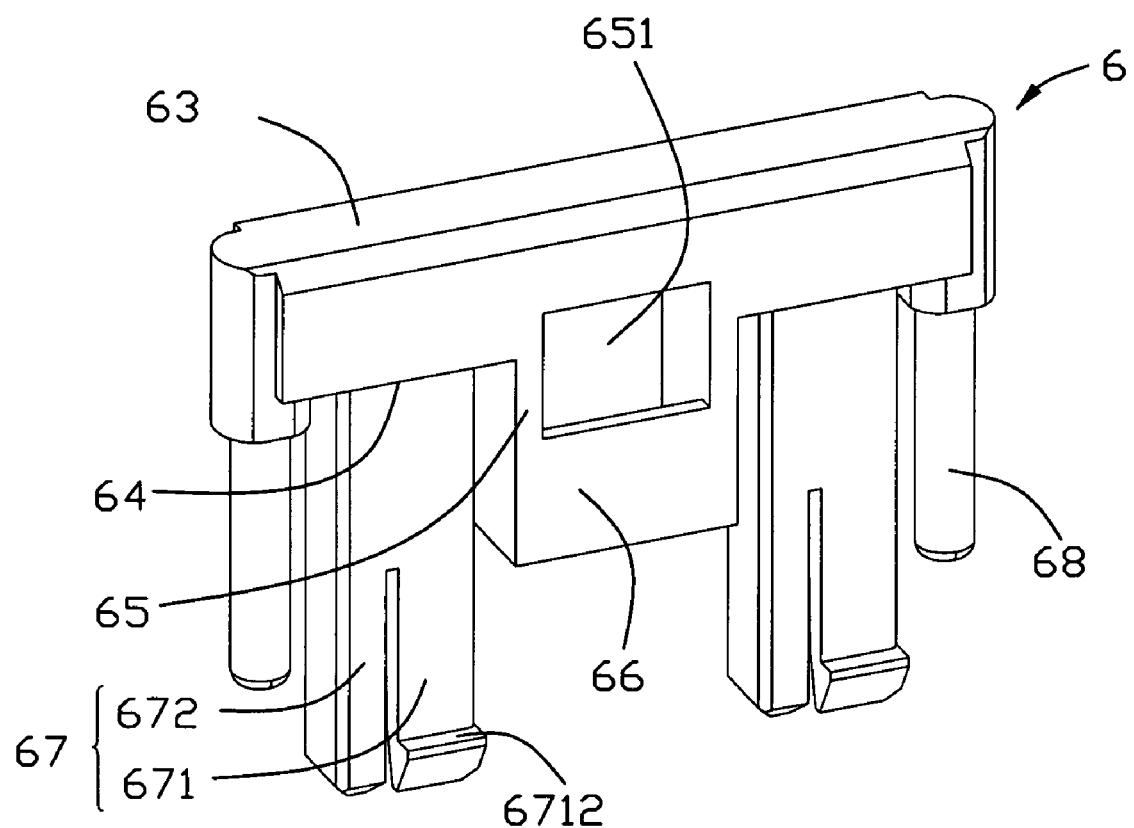
FIG. 4 is a perspective view of a pressing member of the IC socket according to the embodiment of the present invention.
Figure 5:
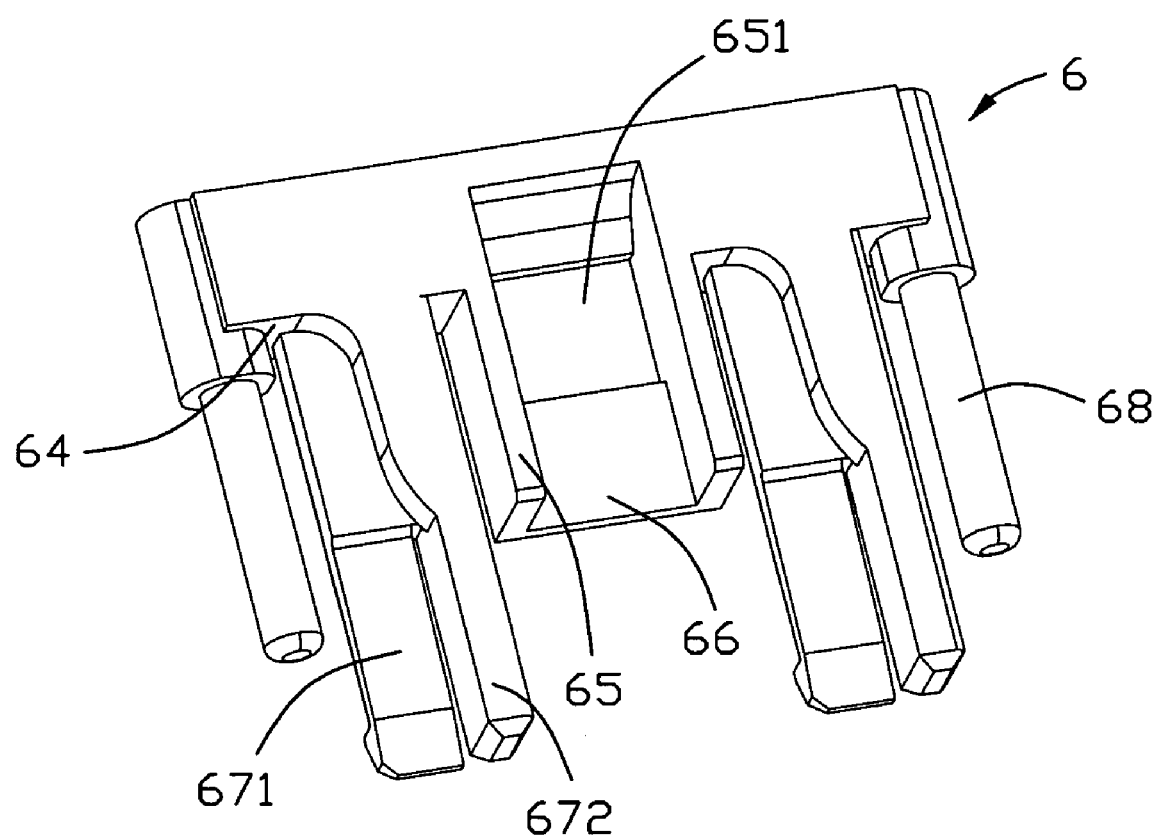
FIG. 5 is similar to FIG. 4, but taken from another side.

Now please referring to FIG. 4 and FIG. 5, the pressing member 6 is formed with a plate-shaped configuration and comprises a first surface 63 for sustaining an operating force applied thereon and a second surface 64 opposed to the first surface 63. A pair of pressing tabs 65 for engaging with corresponding latch 5 extend from the second surface 64 and toward the base 2, respectively. A horizontal member 66 is integrally formed with the pair of the pressing tabs 65, with two ends thereof respectively and physically connecting with corresponding pressing tabs 65 in order to enhance the intensity of the pressing tabs 65 of the pressing member 6. The horizontal member 66 is positioned below the second surface 64. The pressing member 6 defines an opening 651 above the horizontal member 66 and between the two pressing tabs 65. A pair of guiding posts 67 extend from the second surface 64 and beside the pressing tabs 65 in order to guide the pressing member 6. The guiding post 67 consists of a first guiding part 671 formed with a hook 6712 extending upright from a bottom thereof, and a column-shaped second guiding part 672 spaced from the first guiding part 671. Further, a pair of columns 68 extend downwardly from two opposed ends of the pressing member 6, respectively.

Figure 3:
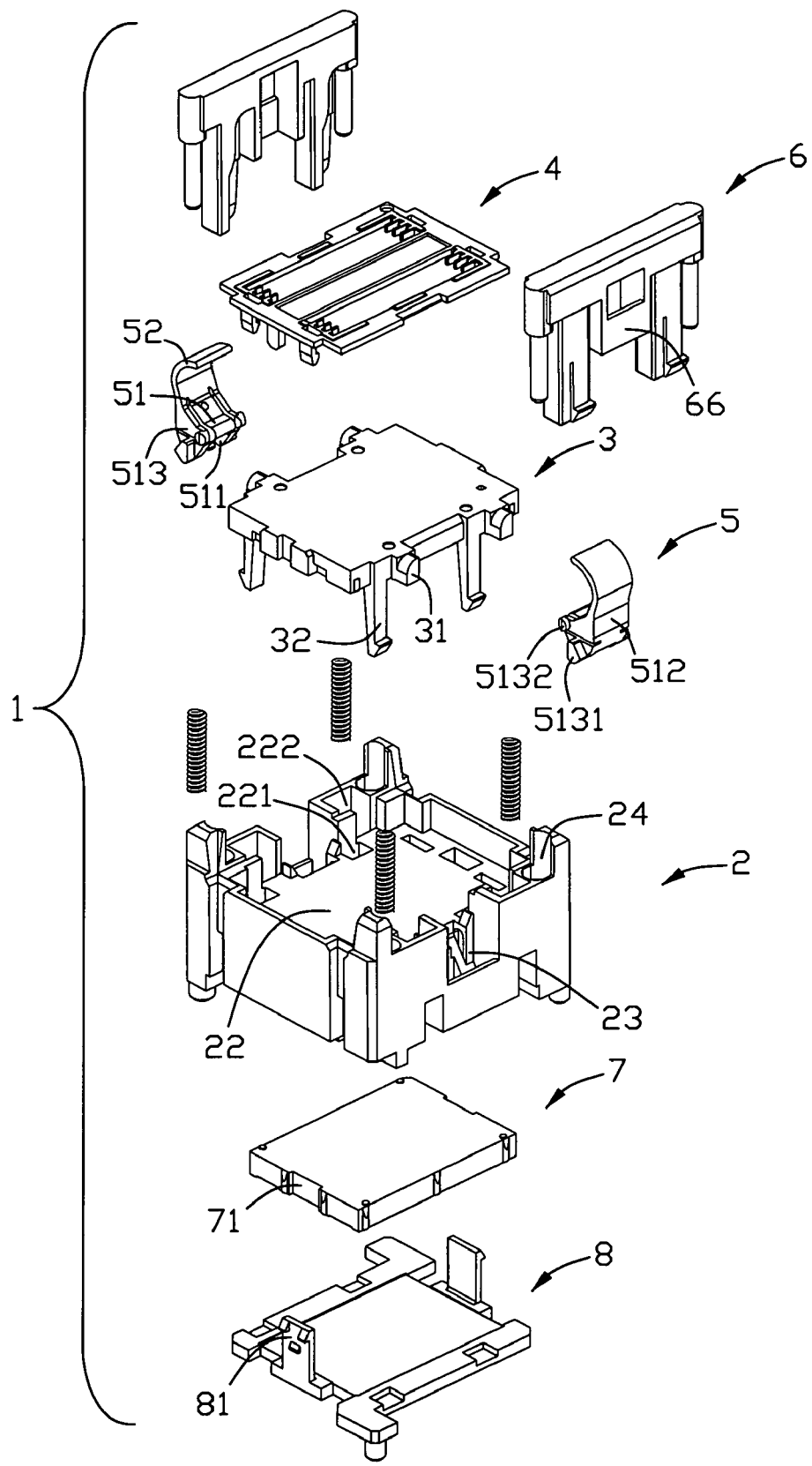
FIG. 3 is an exploded, perspective view of the IC socket according to the embodiment of the present invention.

Referring to FIG. 3, the slider 3 is moveably assembled in the base 2 and has four legs 32 extending into the base 2. Four arc surfaces 31 are formed at each pair of the opposed edges (not labeled) of the slider 3, so as to engage with the second guiding parts 672 of the pressing member 6. The loading plate 4 is positioned on the slider 3 for loading the IC package.

Figure 2:
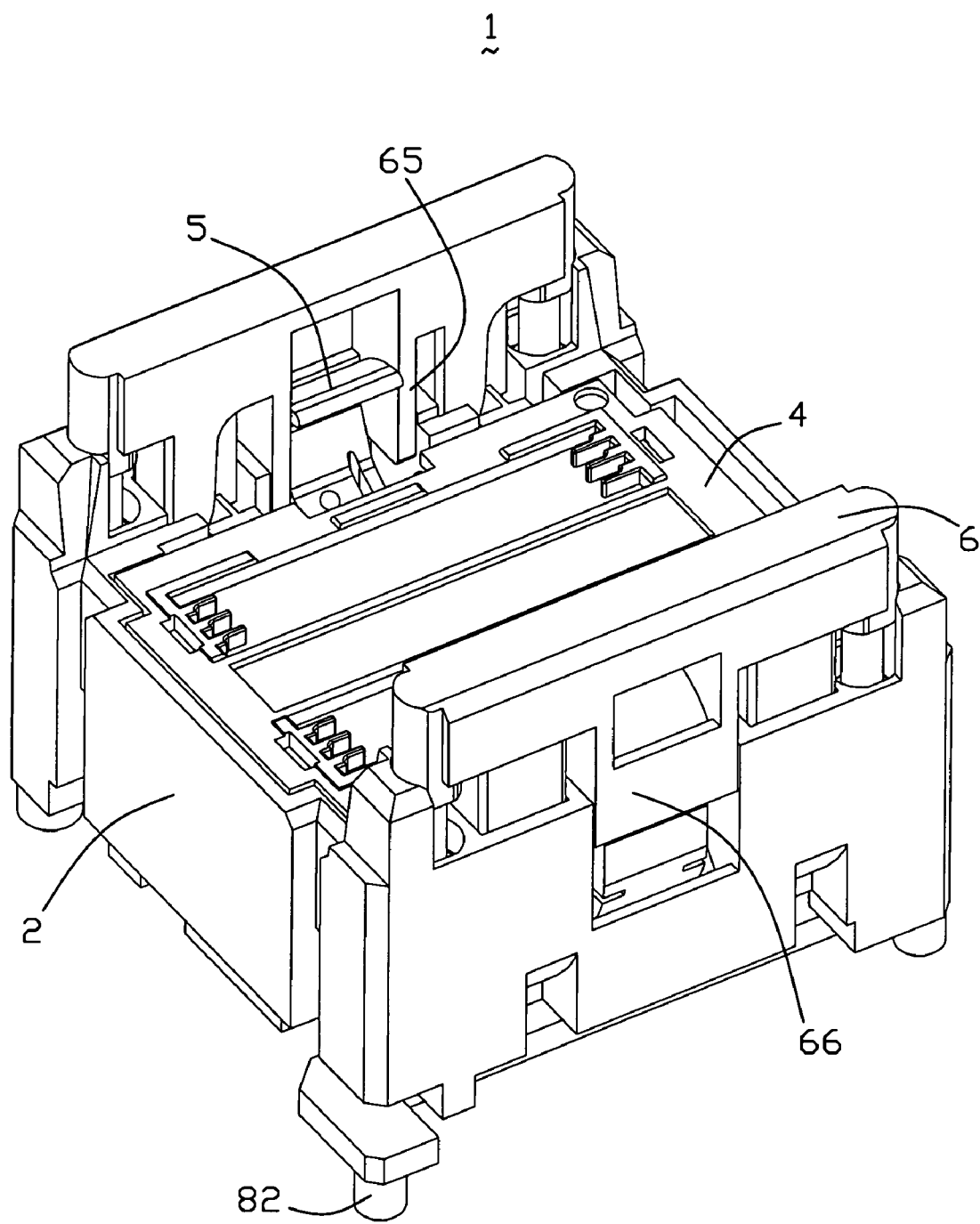
FIG. 2 is an assembled, perspective view of an IC socket according to a preferred embodiment of the present invention.

Referring to FIG. 2 and FIG. 3, the base 2 has a structure of a rectangular shape, and defines a cavity 22 at the middle portion on a top surface (not labeled) thereof for receiving the slider 3. Four holding holes 221 are defined at a bottom surface of the cavity 22 for receiving of the legs 32 of the slider 3. Another four accommodating holes 222 are formed at four corners of the base 2, for accommodating the guiding posts 67 of the pressing member 6. A pair of recesses 23 are formed at each pair of the opposing edges (not labeled) of the base 2 in order to respectively provide operating space for the pressing tabs 65, the horizontal member 66 and the latch 5. Each corner of the base 2 further has a guiding hole 24 for receiving a coil spring (not labeled) and the column 68 of the pressing member 6 therein. The coil spring is used providing a biasing force for repositioning the pressing member 6 back to its original position.

Referring to FIG. 3, the latches 5 are pivotably attached to the base 2 and assembled in the recesses 23, and including a retaining portion 51 and an arc-shaped latching portion 52 curved upwardly from the retaining portion 51. The retaining portion 51 has a bottom face 511, a top face 512 and a pair of side faces 513 in an approximately triangle-shape. A pair of carriers 5131 and a pair of pins 5312 extend outwardly from the side faces 513 respectively. The latches 5 are mounted in the recesses 23 by the pins 5132. The latches 5 return to its original position by the actuation of a spring member (not shown) engaged to the bottom face 511 of the latch 5. The latching portion 52 extends from the top face 512 and has an approximately arc-shape.

Referring to FIG. 3, the locking apparatus includes the positioning plate 8 and the bottom plate 7 located above the positioning plate 8. Two opposed edges of the bottom plate 7 are respectively formed with a notch 71, and two opposed edges of the positioning plate 8 are respectively formed with a locking portion 81 extending upwardly from a middle portion thereof. The locking portion 81 extends through the notch 71 of the bottom plate 7 and then engages with the base 2.

The pressing member 6 moves downwardly when an operating force is applied on the first surface 63, and the pressing tabs 65 then press the carriers 5131 of the latch 5. The latch 5 therefore rotates away from each other so as to create an opening position centered on pins 5132, pushing against the spring element and therefore permits a loading of the IC package being seated into the socket for testing. When the operating force is released from the pressing member 6, the pressing member 6 will resume to an initial position by the operation of the coil spring and the latching portion 52 is urged to press securely the IC package by the functioning of the spring element.

These two pressing members 65 according to the present invention are available alternatively to be formed as a frame structure, with an opening at the middle portion thereof to allow a mounting of the IC package.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An IC socket comprising:
   a base holding a plurality of contacts therein;
   at least one latch pivotably attached to the base; and
   at least one pressing member moveably assembled to the base, the pressing member comprising at least one pair of pressing tabs extending toward the base and abutting against the latch so as to actuate the latch to pivotally move relatively away from the base, a horizontal member physically connecting with the pair of pressing tabs, and an opening defined above the horizontal member and between the two pressing tabs;
   wherein said pressing member has a first surface for receiving an operating force and a second surface opposed to the first surface, and wherein said pressing tabs extend downwardly from said second surface respectively;
   wherein said latch has a pair of side faces and a pair of carriers respectively extending outwardly from corresponding side face, and wherein said carriers engage with the pressing tabs of said pressing member;
   wherein said base has at least one recess formed at edges thereof, and said latch is pivotally mounted in the recess;
   wherein said IC socket further comprising a slider located above said base.

2. The IC socket according to claim 1, further comprising a loading plate positioned on said slider.

3. The IC socket according to claim 2, further comprising a locking apparatus located at the bottom of said base and consisting of a positioning plate and a bottom plate located above the positioning plate.

4. An IC socket comprising:
   a base holding a plurality of contacts therein;
   at least one latch pivotably attached to the base;
   at least one pressing member moveably assembled to the base, the pressing member having a first surface and a second surface opposed to the first surface;
   at least one pair of pressing tabs extending downwardly from the second surface and engaging with the latch to actuate the latch to pivotally move relative to the base; and
   a horizontal member physically connecting with the pair of pressing tabs and positioned below the second surface;
   wherein an opening is defined above the horizontal member and between the pair of the pressing tabs;
   wherein said latch has a pair of side faces and a pair of carriers respectively extending outwardly from corresponding side face, and wherein said carriers engage with the pressing tabs of said pressing member;
   wherein said base has at least one recess formed at edges thereof, and said latch is pivotally mounted in the recess;
   wherein said IC socket further comprising a slider located above said base.

5. The IC socket according to claim 4, further comprising a loading plate positioned on said slider.

6. The IC socket according to claim 5, further comprising a locking apparatus located at the bottom of said base and consisted of a positioning plate and a bottom plate located above the positioning plate.

7. An IC socket comprising:
   an insulative base holding a plurality of contacts therein and defining a plurality of side walls;
   a latch pivotally mounted on at least one of said side walls; and
   a pressing member up and down moveably mounted on said at least one of the side walls; wherein
   said pressing member defines a pair of opposite pressing tabs configured to press the latch, each of said pressing members extending in a first plane perpendicular to a first transverse direction, and a connection bar linked between said pair of pressing tabs for reinforcement and extending in a second plane perpendicular to a second transverse direction perpendicular to said first transverse direction, under a condition that said pair of pressing tabs cooperate with said connection bar to commonly define a space in which the latch is rotatably received;
   wherein said connection bar is essentially located at an outer edge of the each of said pressing tabs away from a center of the base;
   wherein an opening is located adjacently above said connection bar in said second plane, and is configured to receive an upper end of the latch when said pressing member is moved to a lower position;
   wherein said IC socket further comprising a slider located above said base.

* * * * *